United States Patent [19]
Pfiester

[11] Patent Number: 4,745,079
[45] Date of Patent: May 17, 1988

[54] METHOD FOR FABRICATING MOS TRANSISTORS HAVING GATES WITH DIFFERENT WORK FUNCTIONS

[75] Inventor: James R. Pfiester, Austin, Tex.

[73] Assignee: Motorola, Inc., Schaumburg, Ill.

[21] Appl. No.: 31,299

[22] Filed: Mar. 30, 1987

[51] Int. Cl.⁴ .......................................... H01L 21/265
[52] U.S. Cl. ......................... 437/029; 148/DIG. 82; 357/23.5; 357/23.14; 437/45; 437/46; 437/157
[58] Field of Search .................... 437/29, 46, 45, 157; 357/23.14, 23.5

[56] References Cited

U.S. PATENT DOCUMENTS

| | | | |
|---|---|---|---|
| 4,282,646 | 8/1981 | Fortino et al. | 437/45 |
| 4,379,001 | 4/1983 | Sakai et al. | 437/46 |
| 4,382,826 | 5/1983 | Pfleiderer et al. | 437/29 |
| 4,466,175 | 8/1984 | Coe | 437/157 |
| 4,555,842 | 12/1985 | Levinstein et al. | 437/46 |
| 4,559,694 | 12/1985 | Yoh et al. | 29/571 |
| 4,560,419 | 12/1985 | Bourassa et al. | 437/29 |

Primary Examiner—Upendra Roy
Attorney, Agent, or Firm—John A. Fisher; Jeffrey Van Myers; David L. Mossman

[57] ABSTRACT

A method for fabricating an insulated gate field effect transistor (IGFET) having a semiconductor gate with a first portion and a second portion where the portions are of two different conductivity types. Typically, a central portion of the gate, such as a doped polysilicon gate of a first conductivity type, is flanked by end portions near the source/drain regions, where the end portions are doped with an impurity of a second conductivity type. A semiconductor material layer, such as polycrystalline silicon (polysilicon) is selectively protected by a gate pattern mask whereby the end portions of the gates are produced by the lateral diffusion of the dopant under the edges of the gate pattern mask. Thus, the technique for defining the different portions of the gate uses other than photolithographic techniques which are limited in their resolution capabilities, and thus is readily implementable in submicron device feature processes.

21 Claims, 3 Drawing Sheets

METHOD FOR FABRICATING MOS TRANSISTORS HAVING GATES WITH DIFFERENT WORK FUNCTIONS

CROSS-REFERENCES TO RELATED APPLICATIONS

The present application is related to U.S. patent application Ser. No. 031,302, relating to short-channel insulated gate, metal-oxide-semiconductor transistors having gates with different work functions which provide a variable flatband voltage; as well as to U.S. patent application Ser. No. 038,301, relating to another particular kind of short-channel insulated gate, metal-oxide-semiconductor transistor; and U.S. patent application Ser. No. 031,304, relating to another particular method for making the devices of the applications Ser. Nos. 031,301 and 031,302.

FIELD OF THE INVENTION

The invention relates to methods for fabricating insulated gate field effect transistor (IGFET) device structures, and relates more particularly to processes for making IGFETs having multiple work functions.

BACKGROUND OF THE INVENTION

Insulated gate field effect transistors (IGFETs), and the subclass of metal-oxide-semiconductor (MOS) FETs are well-known in the art of designing and fabricating integrated circuits. For example, FIG. 2 illustrates a prior art n-channel MOS transistor 10 in a p$^-$ semiconductor substrate 12 having n$^+$ source/drain regions 14 and 16, covered by a thin gate dielectric layer 18 upon which rests a gate 20 of conductive material. The channel under the gate 20 between the source and drain 14 and 16 has a length, L, that the carriers travel between the source and drain regions 14 and 16. The field effect transistor 10 of FIG. 2 has a significant disadvantage in that the threshold voltage, $V_T$, usually varies with respect to geometry, the channel length L measured in the direction X, and the drain bias.

For long channel field effect devices, the device can be designed so that this problem can be minimized or ignored. However, as L decreases, there is a considerable problem with a diminishing $V_T$, such as is seen schematically in curve A of FIG. 3. For a longer length $L_1$, $V_T$ is fairly well-behaved and constant. However, as L decreases to $L_2$, with conventional devices the $V_T$ drops off appreciably. This effect severely impairs device performance and makes it difficult to design integrated circuits with these short channel lengths.

Ideally, the $V_T$ vs. L curve should appear more like curve B, that is, flatter for a greater L range, so that $V_T$ remains fairly constant even for very short channel lengths. This depletion layer shape affects the $V_T$ as well. Thus, it would be advantageous to have a field effect or MOS device with a minimum of $V_T$ variation with respect to channel length and the drain bias. It has recently been discovered that such devices may be provided by having a FET employing a semiconductor material gate where portions of the gate are doped with impurities of the two different conductivity types. For example, in a specific embodiment, the central portion of a polycrystalline silicon gate may be doped n$^+$ conductivity type and the ends of the gate may be doped p$^-$ to p$^+$ conductivity type.

The only publication known which reveals the use of insulated gate field effect transistors having gates of more than one conductivity type electrically connected is U.S. Pat. No. 4,559,694 to Yoh, et al. This patent concerns a method of manufacturing a reference voltage generator device. The gates of the IGFETs have central portions and end portions where the conductivity types of the end portions and the central portions are different. Sometimes the end portions and the central portions of the gates were separated by a portion of intrinsic semiconductor material. However, in all cases described in the patent, the impurity level of the end portions of the gate electrode was the same as the impurity level of the source/drain regions on either side of the entire gate, for they were formed in the same step. Therefore, of course, in all instances the conductivity type of the gate end portions and the source/drain regions are the same. Although channel length dimensions are not mentioned in U.S. Pat. No. 4,559,694, it is expected that they would be considerably longer that those of concern in the present invention to be able to form the voltage reference functions required.

This characteristic is important because the problems with threshold voltage control discussed above are not apparent until the channel length approaches submicron levels. Of course, the minimum channel length, L, for any particular device, depends on the channel doping level and the gate oxide thickness. Nevertheless, it is expected that only devices with channel lengths longer than about 5 um could be made with the method of U.S. Pat. No. 4,559,694. The fabrication methods taught therein are completely incompatible with devices having channel lengths in the micron to submicron realm, and rely heavily on photolithographic resolution. It is generally recognized that photolithographic resolution techniques reach their limits at about one micron.

It would be advantageous if a method could be discovered for fabricating FETs with semiconductor material gates where different portions of the gates have different conductivity types, and where techniques other than photolithographic techniques are employed for resolving the different portions of the gates

SUMMARY OF THE INVENTION

Accordingly, it is an object of the present invention to provide a technique for fabricating FETs having minimum threshold voltage variation with respect to channel length and drain bias.

It is yet another object of the present invention to provide a field effect device where the flatband voltage, $V_{FB}$, of the gate is no longer constant, but is a function of distance X across the channel L.

Still another object of the invention is to provide a method for fabricating FETs having gates of semiconductor devices of different conductivity types, where the different portions of the gates are defined by techniques other than photolithographic resolution. It is yet another object of the present invention to provide a technique for fabricating FETs with gates of different conductivity types where the impurity concentrations in the end portions of the gates and the source/drain regions are different.

In carrying out these and other objects of the invention, there is provided, in one form, a method for fabricating a transistor having a gate with different work function which begins by providing a semiconductor substrate and then forming a layer of gate dielectric material on the semiconductor substrate. Next, a layer of semiconductor material is formed on the gate dielectric material layer. A pattern of masking material is now provided on the layer of semiconductor material. Selected areas of the layer of semiconductor material are exposed through the masking material pattern. The next step involves the introduction of an impurity of a first conductivity type into the selected areas of the semiconductor material layer, and then diffusing the impurity a selected distance into the semiconductor material layer laterally under the masking material pattern.

It should be noted that the drawings are not to scale, since various of the elements are exaggerated in the vertical dimension relative to the horizontal dimension for clarity.

DETAILED DESCRIPTION OF THE INVENTION

Figure 1:
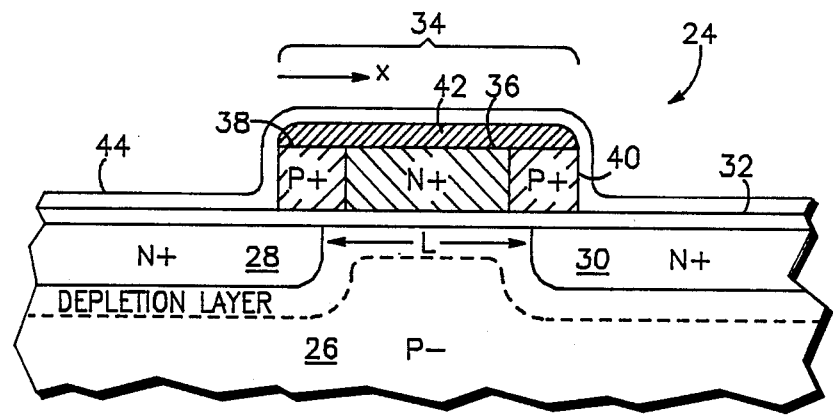
FIG. 1 is a cross-sectional illustration of one embodiment of the transistor having a gate with different work functions made according to the fabrication method of the present invention.
Figure 2:
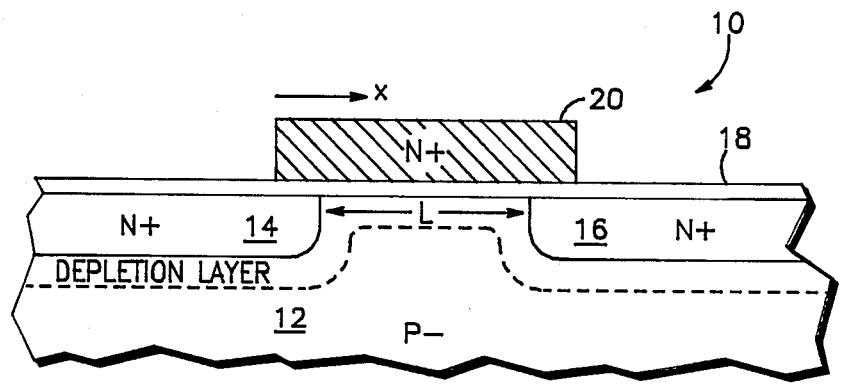
FIG. 2 is a cross-sectional illustration of a conventional field effect transistor for comparison with the FET of FIG. 1.
Figure 3:
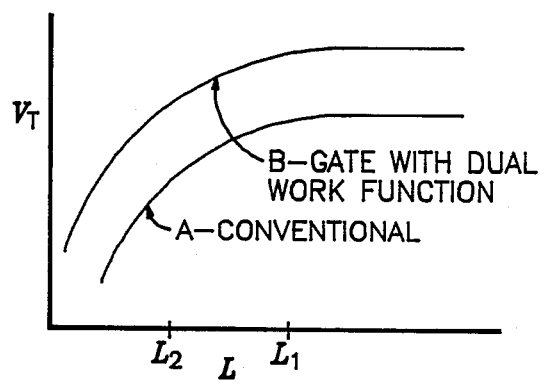
FIG. 3 is qualitative plot of threshold voltage, $V_T$, with effective channel length, L, demonstrating the dependency of $V_T$ with L in accordance with conventional and inventive field effect devices.

Shown in FIG. 1 is a field effect transistor 24 fabricated within a semiconductor substrate 26 of a first conductivity type. Spaced apart source/drain regions 28 and 30 are regions of the substrate 26 counterdoped to be of a second conductivity type. On the surface of substrate 26 is a gate dielectric layer 32 in turn bearing a gate 34 covering the channel of length L between source/drain regions 28 and 30. One of the distinguishing features of the inventive structure of the present invention is the gate 34 being of a semiconductive material of two different conductivity types.

For example, in the embodiment illustrated in FIG. 1, there is a central portion 36 of a first conductivity type and end portions 38 and 40 of a second conductivity type. While it is well known to form multiple element gates, as in double polycrystalline silicon dynamic random access memories (DRAMs), the different portions of the gates are always insulated from each other, as contrasted to the structure of the instant invention where the end portions of the gate 38 and 40 are next to and in electrical contact with the central portion of the gate 36.

Of course, it is realized that this structure will form diodes on the ends of the gate, so that it may be necessary to strap the portions 36, 38 and 40 of the gate together with an optional conductive material strap 42 to ensure that all portions of the gate 34 are tied together electrically. The FET 24 may also have an insulating dielectric layer 44 to insulate the gate 34 from the other elements of the integrated circuit.

The particular FET 24 illustrated in FIG. 1 is an n-channel device where the substrate 26 is p− conductivity type and the source/drain regions 28 and 30 are of n+ conductivity type. It is anticipated that the device of the present invention would also function as expected were the conductivity types to be reversed. In the present embodiment, however, the central portion 36 of the gate 34 is to be of a different conductivity type from that of the substrate 26, in other words, the same conductivity type as the source/drain regions 28 and 30. Stated another way, if the substrate 36 is of p conductivity type, the central portion 36 of gate 34 should be n conductivity type, and if the substrate 26 is n type, the central portion 36 should be p type. Of course, the gate end portions 38 and 40 are to be of the opposite conductivity type of the central portion 36.

Further, for the purposes of illustration only, it will be understood that semiconductor substrate 26 is monocrystalline silicon, that the gate 34 is polycrystalline silicon or polysilicon, and that the gate dielectric material 32 is silicon dioxide, or simply oxide. Other suitable materials may be used for these elements and the device would have a structure and function similar in kind to that of the present invention. For example, the substrate might be gallium arsenide, or the dielectric material may incorporate silicon nitride.

With respect to the performance of the inventive device, the extra end portions 38 and 40 provide a different work function on the end of the gate 34 from that in the central part of the gate 36. In effect, three transistors are present in series with their gates tied together, the central transistor having an n+ gate 36, while the end transistors have gates 38 and 40, doped with an impurity from p− to p+ conductivity. End gate portions 38 and 40 may also be of p or p+ doped semiconductor material as well. The exact impurity level must be optimized with the other device parameters. The magnitude of the flatband voltage of the gate 34 is no longer constant across L, but diminishes at both ends. The "edge transistors" have a higher $V_T$ than the "central transistor", and so as L decreases, the "effective" $V_T$ of the entire device would become less dependent on L. The structure seen in FIG. 9 would operate somewhat differently in that the end portions 38 and 40 would counteract the charge sharing in the silicon substrate bulk region 26, and $V_T$ would still become less dependent on L.

Figure 4:
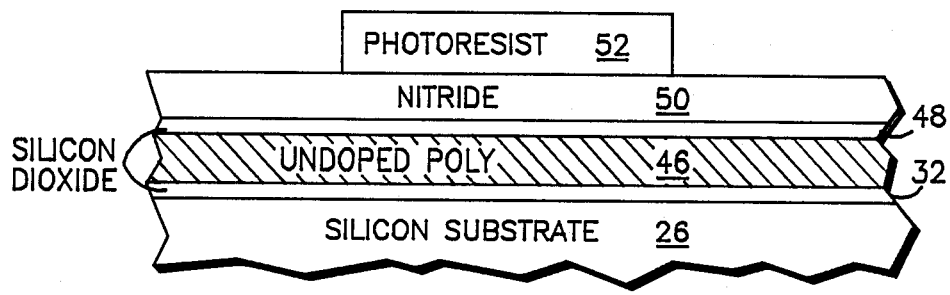
FIGS. 4 through 6 are cross-sectional illustrations of a FET under construction in accordance with the process of the present invention.
Figure 5:
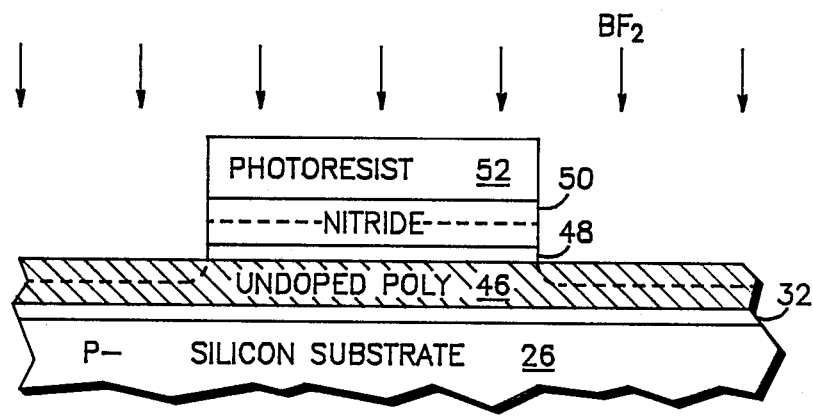
Figure 6:
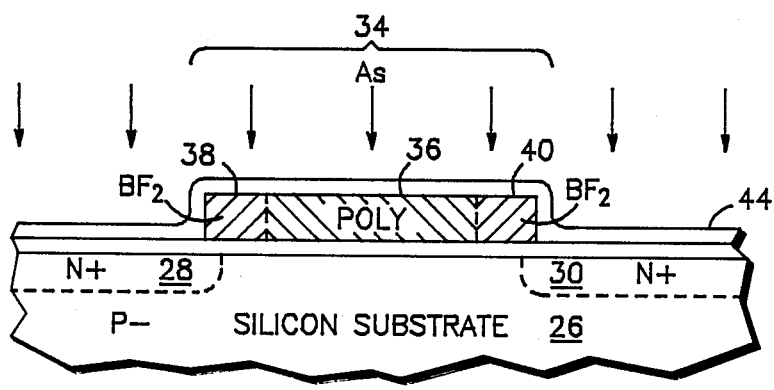

One embodiment of the process of the present invention is illustrated in FIGS. 4 through 6. Similar reference numbers to those used in FIG. 1 will be employed in this discussion for clarity. Shown in FIG. 4 is a monocrystalline silicon substrate 26 upon which a gate oxide layer 32 is formed, by deposition or growth, such as a conventional thermal growth process. A layer 46 of undoped polycrystalline silicon is formed, typically by deposition, on top of the gate oxide layer 32; this poly layer 46 ultimately forming gate 34. In one embodiment of the invention the polysilicon layer 46 should have vertically oriented grains.

Upon the layer of poly 46 is thermally grown a second thin layer of silicon dioxide 48, over which is deposited a layer of silicon nitride 50. The silicon oxide layer 48 may be considered optional, although it may find utility as an etch stop layer in some anticipated embodiments of the present process. Upon this stack, a photoresist pattern 52 is formed in a conventional manner.

Shown in FIG. 5 is the result of the etch performed after the photoresist 52 patterning. This etch should be designed to stop on polysilicon layer 46. Before stripping photoresist pattern 52 and taking silicon substrate 26 to be p⁻ doped, a p-type dopant such as boron in the form of $BF_2$ or $B^{11}$, for examples, should be introduced into the polysilicon layer 46 as shown in FIG. 5. This impurity will dope what is ultimately to become the end portions 38 and 40 of gate 34. After the photoresist 52 is stripped, the patterned nitride layer 50 serves as a mask to prevent the boron impurity from doping the future central portion 36 of gate 34, and as a hard mask during the polysilicon 46 etch.

Next, the polysilicon layer 46 is annealed to cause lateral movement of the $BF_2$ into the polysilicon 46. Also during this anneal step will occur a $BF_2$ equilibrium distribution along the vertical polysilicon grains, as well as fluorine outgassing. One set of conditions for the anneal step might be from about 800°–850° C. for 30 to 60 minutes. The dose, energy and anneal conditions for the $BF_2$ would be determined by simulation and experimentation to create an optimum $V_T$ vs. L correlation.

Next, the polysilicon layer 46 is etched using the silicon nitride layer 50 and second thin oxide layer 48 as a mask to form gate 34. After nitride layer 50 is stripped off, a thermal oxidation step should be performed which will repair and form gate oxide 32 at the gate 34 edges. Then the n+ source/drain regions 28 and 30 are implanted, at perhaps 5E15, 70 keV using arsenic, although other conditions and dopants might be used. This implant, which is shown in FIG. 6, also converts the polysilicon layer 46 to n+ conductivity to create the central portion 36 of gate 34. The end portions 38 and 40 will be back-compensated to some extent, but the doping levels should be adjusted so that the end portions remain p⁻ or p+ conductivity.

Using this process, the $BF_2$ in the poly layer 46 should be self aligned to the arsenic implant in the silicon substrate 26. From this point, the device should continue fabrication with conventional processing. Optional steps would include the provision of a conductive material strap 42 such as seen in FIG. 1. Strap 42 may be of metal, a doped semiconductor material such as doped polysilicon, a refractory metal silicide, or any combination of these. The strap may be necessary to insure that all portions 38, 40 and 36 are all electrically connected. An additional dielectric insulating layer 44 may also be provided as shown in FIGS. 1 and 6.

Preliminary experiments have been conducted using this process, and it has been demonstrated that boron in the form of $BF_2$ can be introduced only into the edge portions 38 and 40 of gate 34 as expected. A lateral diffusion of approximately 0.5 um was achieved for a specific set of thermal annealing conditions. Those skilled in the art will be able to adjust these regions with accuracy.

Figure 7:
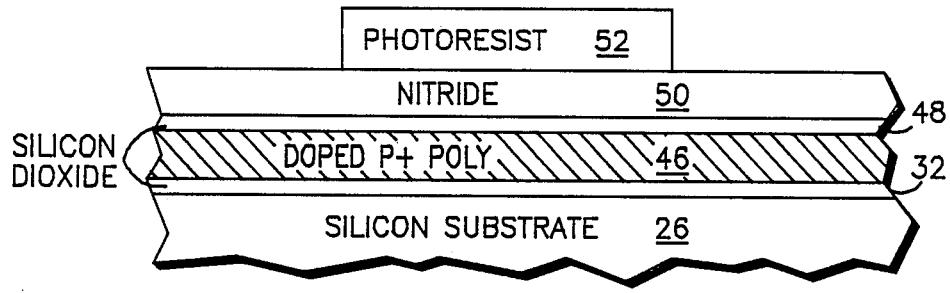
FIGS. 7 through 9 are cross-sectional illustrations of a FET under construction in accordance with another embodiment of the process of the present invention.
Figure 8:
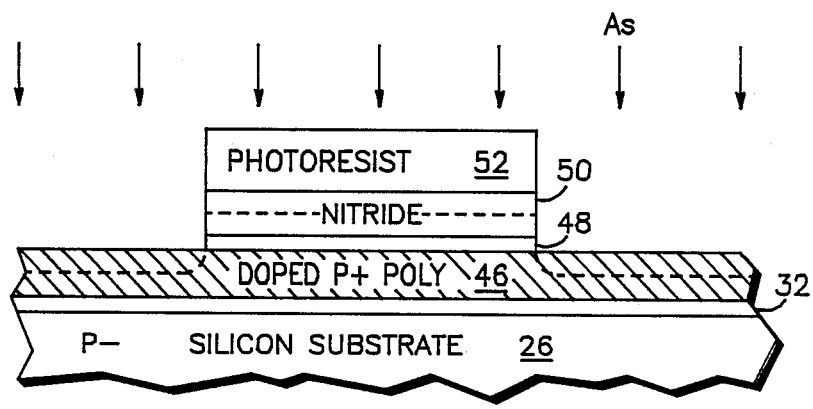
Figure 9:
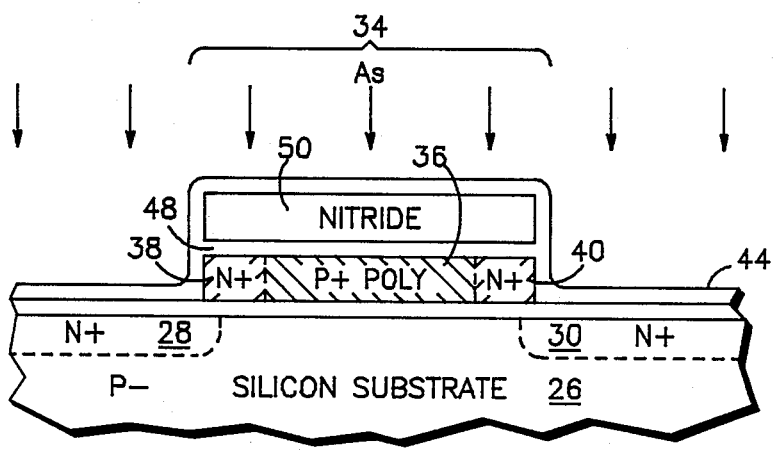

Shown in FIGS. 7 through 9 is a method for manufacturing an IGFET with a polysilicon gate having two different work functions where the conductivity types are reversed from that shown in FIGS. 4 through 6. The process would differ in two important particulars. First, the blanket polysilicon layer 46 must be doped prior to the introduction of the implant shown in FIG. 8. This doping may be conducted in any suitable way, such as by doping layer 46 in situ (as it is formed), or by a subsequent blanket implant of a p-type impurity such as boron, or by diffusion, etc. After the patterning is done using the patterned nitride 50 as a hard mask, a dopant of the the opposite conductivity type such as arsenic is implanted and laterally diffused into the doped poly layer 46 and underneath the nitride 50/oxide 48 mask.

Then, as before, the nitride 50 is used as a hard mask for the etch of poly 46. But instead of removing the nitride 50, it remains on the gate to shield the gate from the source/drain implant as demonstrated in FIG. 9.

If nitride layer 50 is stripped prior to the ion implantation of n+ source/drains 28 and 30, then the p+ dose, which may be $BF_2$ for example, in the center portion 36 of gate 34 should be greater than the source/drain n+ dose to allow the center region 36 of the gate 34 to remain p+. If nitride layer 50 is not stripped prior to the n+ implantation of source/drains 28 and 30, then the $BF_2$ dose may be less than the source/drain 28 and 30 n+ dose. A suggestion for the $BF_2$ dose in the poly layer 46 in FIG. 7 is approximately 1E16, whereas a suggestion for the arsenic implant dose shown in FIG. 8 is approximately 2E16, although one skilled in the art may certainly modify these parameters to meet the requirements of the device characteristics.

I claim:

1. A method for fabricating an insulated gate field effect transistor (IGFET) comprising the steps of:
    providing a semiconductor substrate;
    forming a layer of gate dielectric material on the semiconductor substrate;
    forming a layer of semiconductor material on the gate dielectric material layer;
    providing a pattern of masking material on the layer of semiconductor material, through which selected areas of the layer of semiconductor material are exposed;
    introducing an impurity of a first conductivity type into the selected areas of the semiconductor material layer;
    diffusing the impurity of the first conductivity type a selected distance into the semiconductor material layer laterally under the masking material pattern, wherein the selected distance is less than that required to completely dope the semiconductor material under the masking material pattern, leaving a central portion of the conductive material pattern undoped with the impurity of the first conductivity type; and
    providing an impurity of a second conductivity type into the central portion.

2. The process of claim 1 wherein a thin layer of dielectric material is provided on top of the layer of semiconductor material before the formation of the masking material pattern.

3. The process of claim 1 wherein a thin layer of dielectric material is provided over the gate after the selected areas of the semiconductor material are removed, prior to the introduction of an impurity of a second conductivity type in the central portion of the gate and the source/drain regions.

4. The process of claim 1 wherein after the introduction of the impurity of the second conductivity type into the central portion of the gate, a strap of conductive material is provided over the end portions and the central portion of the gate to strap them together electrically.

5. The process of claim 1 wherein after the diffusion of the impurity of the first conductivity type a selected distance laterally into the semiconductor material layer, the selected areas of the semiconductor material are removed to leave a gate of semiconductor material having end portions and a central portion between the end portions, the end portions being doped with the impurity of a first conductivity type.

6. The process of claim 5 wherein after the selected areas of the semiconductor material layer are removed, an impurity of a second conductivity type is introduced into the central portion of the gate and the semiconductor substrate using the gate as mask to simultaneously form a doped central portion and doped source/drain regions respectively, of a second conductivity type.

7. The process of claim 5 wherein the pattern of masking material is removed after the selected areas of the semiconductor material are removed.

8. A method for fabricating an insulated gate field effect transistor (IGFET) comprising the steps of:
providing a semiconductor substrate lightly doped with an impurity;
forming a layer of gate dielectric material on the semiconductor substrate;
forming a layer of semiconductor material on the gate dielectric material layer;
providing a pattern of masking material on the layer of semiconductor material, through which selected areas of the layer of semiconductor material are exposed;
introducing an impurity of a first conductivity type into the selected areas of the semiconductor material layer;
diffusing the impurity of the first conductivity type in the selected areas of the semiconductor material layer a selected distance into the semiconductor material layer laterally under the masking material pattern, wherein the selected distance is less than that required to completely dope the semiconductor material under the masking layer, leaving a central portion of the conductive material pattern undoped with the impurity of the first conductivity type;
removing the selected areas of the semiconductor material to leave a gate of semiconductor material having end portions and the central portion between the end portions, the end portions being lightly doped with the impurity of the first conductivity type; and
providing an impurity of a second conductivity type in the central portion.

9. The process of claim 8 wherein a thin layer of silicon dioxide is provided on top of the layer of semiconductor material before the formation of the masking material pattern.

10. The process of claim 8 wherein a thin layer of silicon dioxide is provided over the gate after the selected areas of the semiconductor material are removed, prior to the introduction of an impurity of a second conductivity type in the central portion of the gate and the source/drain regions.

11. The process of claim 8 wherein after the introduction of the impurity of the second conductivity type into the central portion of the gate, a strap of conductive material is provided over the end portions and the central portion of the gate to strap them together electrically.

12. The method of claim 8 wherein after the selected areas of the semiconductor material layer are removed, an impurity of a second conductivity type is introduced into the central portion of the gate and the semiconductor substrate using the gate as mask to simultaneously form a heavily doped central portion and heavily doped source/drain regions respectively, of a second conductivity type.

13. The method of claim 8 wherein after the selected areas of the semiconductor material layer are removed, the pattern of masking material is removed.

14. A process for fabricating an insulated gate field effect transistor (IGFET) comprising the steps of:
providing a monocrystalline silicon substrate lightly doped with an impurity of a first conductivity type;
forming a layer of gate silicon oxide on the silicon substrate;
forming a layer of undoped polycrystalline silicon on the gate silicon oxide layer;
providing a pattern of masking material on the layer of polycrystalline silicon, through which selected areas of the layer of polycrystalline silicon are exposed;
introducing an impurity of the first conductivity type into the selected areas of the polycrystalline silicon layer;
diffusing the impurity of the first conductivity type in the selected areas of the polycrystalline silicon layer a selected distance into the polycrystalline silicon layer laterally under the masking material pattern;
removing the selected areas of the polycrystalline silicon to leave a polycrystalline silicon gate having end portions and a central portion therebetween, the end portions being lightly doped with the impurity of a first conductivity type; and
introducing an impurity of a second conductivity type into the central portion of the gate and the silicon substrate using the gate as mask to simultaneously form a heavily doped central portion and heavily doped source/drain regions respectively, of a second conductivity type.

15. The process of claim 14 wherein the polycrystalline silicon layer is doped with an impurity after it is formed and before the masking material pattern is provided.

16. The process of claim 14 wherein a thin layer of silicon dioxide is provided on top of the polycrystalline silicon layer before the formation of the masking material pattern.

17. The process of claim 14 wherein the masking material pattern is selected from the group consisting of silicon oxide, silicon nitride and a combination of silicon oxide and silicon nitride.

18. The process of claim 14 wherein a thin layer of silicon dioxide is provided over the gate after the selected areas of the polycrystalline silicon layer are removed, prior to the introduction of an impurity of a second conductivity type in the central portion of the gate and the source/drain regions.

19. The process of claim 14 wherein after the introduction of the impurity of the second conductivity type into the central portion of the gate, a strap of conductive material is provided over the end portions and the central portion of the gate to strap them together electrically.

20. The process of claim 14 wherein the strap of conductive material is selected from the group consisting of doped semiconductor material, a metal, a refractory metal silicide or a combination thereof.

21. The process of claim 14 wherein the pattern of masking material is removed after the removal of the selected area of polycrystalline silicon.

* * * * *